United States Patent
Nowak et al.

(10) Patent No.: US 6,191,451 B1
(45) Date of Patent: *Feb. 20, 2001

(54) SEMICONDUCTOR DEVICE WITH DECOUPLING CAPACITANCE

(75) Inventors: Edward Joseph Nowak, Essex; Minh Ho Tong, Essex Junction, both of VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/016,026

(22) Filed: Jan. 30, 1998

(51) Int. Cl.[7] .................................................. H01L 27/01
(52) U.S. Cl. .......................... 257/347; 257/355; 257/350; 257/501
(58) Field of Search ..................................... 257/351, 347, 257/355, 350, 500, 357, 501, 502, 503, 504, 349, 353; 438/423, 605, 404, 238, 426, FOR 426

(56) References Cited

U.S. PATENT DOCUMENTS

| | | | |
|---|---|---|---|
| 4,754,314 | * 6/1988 | Scott et al. | 257/70 |
| 5,378,919 | 1/1995 | Ochiai | 257/204 |
| 5,399,507 | * 3/1995 | Sun | 438/152 |
| 5,414,285 | 5/1995 | Nishihara | 257/301 |
| 5,430,318 | * 7/1995 | Hsu | 257/370 |
| 5,489,547 | * 2/1996 | Erdeljac | 438/283 |
| 5,489,792 | * 2/1996 | Hu et al. | 257/347 |
| 5,525,531 | 6/1996 | Bronner et al. | 438/152 |
| 5,525,533 | 6/1996 | Woodruff et al. | 438/394 |
| 5,589,695 | * 12/1996 | Malhi | 257/77 |
| 5,606,188 | 2/1997 | Bronner et al. | 257/301 |
| 5,736,779 | * 4/1998 | Kobayashi | 257/603 |
| 5,740,099 | * 4/1998 | Tanigawa | 365/51 |
| 5,751,041 | * 5/1998 | Suzuki et al. | 257/357 |
| 5,757,054 | * 5/1998 | Miyawaki et al. | 257/390 |

FOREIGN PATENT DOCUMENTS 62-179143  8/1987 (JP).

OTHER PUBLICATIONS

Chan et al., "SOI/Bulk Hybrid Technology on SIMOX Wafers for High Performance Circuits with Good ESD Immunity", IEEE Electron Device Letters, vol. 16, p. 11, Jan. 1995.*

* cited by examiner

*Primary Examiner*—Steven H. Loke
(74) *Attorney, Agent, or Firm*—Schmeiser, Olsen & Watts; Eugene I. Shkurko

(57) ABSTRACT

A semiconductor device is disclosed that provides a decoupling capacitance and method for the same. The semiconductor device includes a first circuit region having a first device layer over an isolation layer and a second circuit region adjacent the first circuit region having a second device layer over a well. An implant layer is implanted beneath the isolation layer in the first circuit region, which will connect to the well of the second circuit region.

16 Claims, 2 Drawing Sheets

SEMICONDUCTOR DEVICE WITH DECOUPLING CAPACITANCE

BACKGROUND OF THE INVENTION

1. Technical Field

The invention relates generally to semiconductor devices, and more specifically, to decoupling capacitance schemes in semiconductor devices.

2. Background Art

Silicon-on-insulator (SOI) CMOS technologies offer higher performance than conventional bulk-substrate CMOS technologies due to factors such as lower junction capacitances. In SOI technology, lower junction capacitances are obtained by isolating the active circuits from the bulk substrate dielectrically.

However, there are several disadvantages in SOI technology compared to bulk-substrate technology. In bulk-substrate technology, there is generally a high chip decoupling capacitance from the power supply Vdd to ground due mainly to N-well to P substrate junction capacitance. High chip decoupling capacitance provides electrostatic discharge (ESD) protection and protection from high switching noises on the chip. Unfortunately, the ESD protection level for input/output (I/O) devices on SOI is degraded due to higher diode resistances, poor thermal conduction and very low on-chip decoupling capacitance from the power supply Vdd to ground. Furthermore, there are high chip and I/O switching noises because of the low on-chip decoupling capacitance. Unless thin-oxide capacitors are used, which consume real estate, a chip in SOI technology has very little decoupling capacitance for noise suppression.

A common method of making SOI devices is to implant oxygen atoms into bulk-substrate devices to form a buried oxide layer. This method is known as SIMOX (separation by implanted oxygen). Several approaches to improve the ESD protection level in SOI technology have been proposed for SIMOX. One of them discloses etching off the oxide layer so that the I/O transistors can be built on bulk substrate. This approach, although demonstrating ESD improvement, requires precise and expensive processing and processing controls (e.g., etching and forming circuits over different wafer topographies). Another approach employs a block mask during oxygen implant to keep the ESD circuitry area in the bulk substrate. For this approach, modified SIMOX wafers can be obtained that would offer both high-performance circuits (SOI) and acceptable ESD protection (bulk substrate). Unfortunately, this approach is deficient without a big on-chip decoupling capacitor for noise suppression and proper ESD operation.

SUMMARY OF THE INVENTION

It is thus an advantage of the present invention to provide a decoupling capacitance for a semiconductor device and the method for making the same that eliminates the above described defects.

The advantages of the invention are realized by a semiconductor device comprising a first circuit region having a first device layer over an isolation layer and a second circuit region adjacent the first circuit region having a second device layer over a well. An implant layer is implanted beneath the isolation layer in the first circuit region, which will connect to the well of the second circuit region, forming a high junction capacitance, and thus an acceptable decoupling capacitance for the semiconductor device.

The foregoing and other advantages and features of the invention will be apparent from the following more particular description of preferred embodiments of the invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements, and.

DETAILED DESCRIPTION OF THE DRAWINGS

Figure 1:
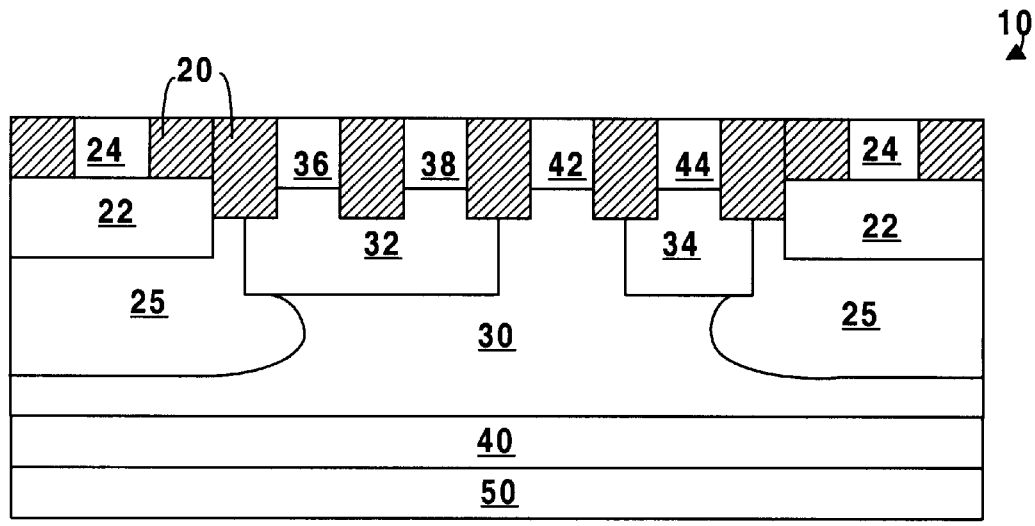
FIG. 1 is a simplified diagram of a semiconductor structure in accordance with a preferred embodiment of the present invention.

Referring to FIG. 1, there is shown, in highly simplified form, a semiconductor structure for an integrated circuit 10 in accordance with the present invention. In this example, a first circuit region of a silicon-on-insulator (SOI) structure comprises isolation oxide layer 22, first device layer 24, isolation layers 20, and a high-dose implant layer 25 of a first polarity type implanted under isolation oxide layer 22 in accordance with an embodiment of the present invention. The second circuit region (e.g., a bulk device region), which is adjacent the first circuit region, comprises bulk area 30, wells 32 and 34 of a first polarity type, second device regions comprising regions 36, 38, 42, and 44 of first and second polarity types, and isolation layers 20. Both circuit regions are located in a substrate 50 of the second polarity type, the first circuit region covering most of the chip. Although only one second circuit region is shown, it will be appreciated that a plurality of such regions may be employed on a single semiconductor substrate, each delineating a subsequent active area of a device. An optional dopant 40 of the second polarity type under the implant layer 25, such as a 1MV energy implant routinely used in non-epi technology, may also be used if more capacitance is desired, or the substrate wafer itself may be a P+ wafer with a P– epitaxial layer on top.

Figure 2:
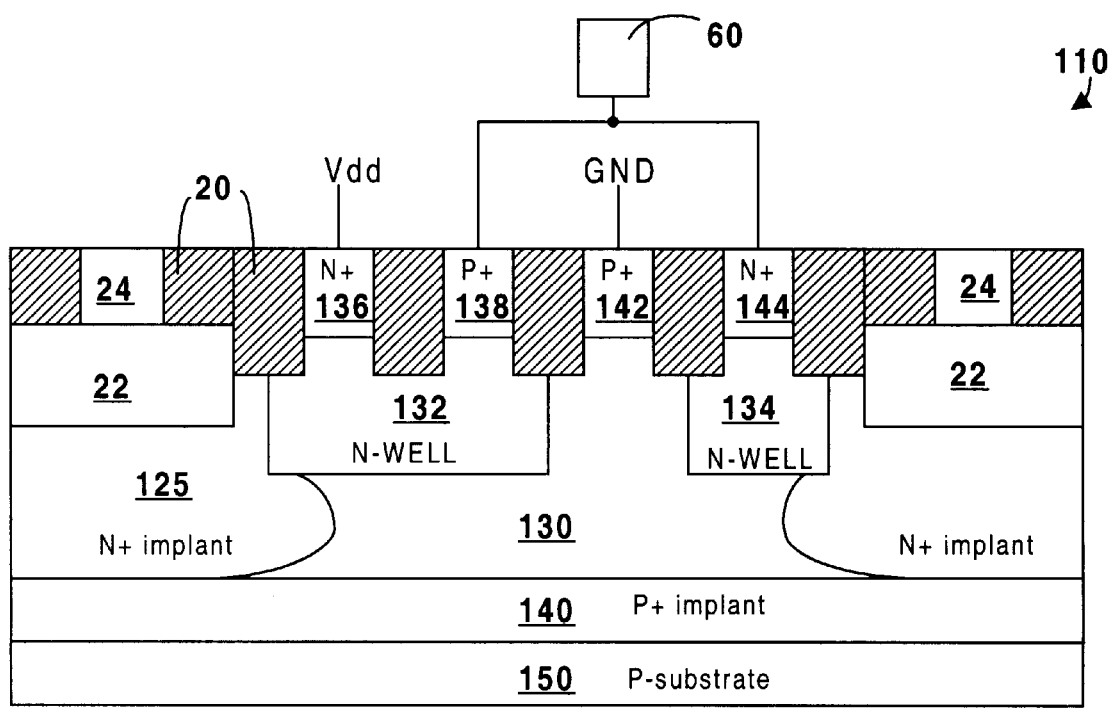
FIG. 2 is an exemplary device used with the structure of FIG. 1.

Referring to FIG. 2, an I/O ESD device 110 is disclosed as an exemplary device that may be integrated into the present invention. Although a P-type substrate 150 with the corresponding polarity type regions is shown in FIG. 2, an N-type substrate, or an N-type substrate with a P-region created by doping, etc. with corresponding regions and modifications to the integrated circuit 110 may also be used. The I/O ESD device 110 is formed from the semiconductor substrate with I/O pad 60 connecting to P+ region 138 and N+ region 144; with N+ region 136 connecting to Vdd to form a first diode; and with P+ region 142 connecting to ground to form a second diode. An I/O ESD device, or similar device, may also be formed from an N-type substrate, with appropriate connections and modifications for proper performance. As aforementioned, an optional P-type dopant 140 under the N-type implant layer (or N-type dopant under the P-type implant layer in the case of a N-type substrate) may also be used if more capacitance is desired.

As can be seen in FIG. 2, a high junction capacitance is then formed from Vdd to ground. Vdd is coupled to the N-type implant layer 125 via N-well 132, which is coupled to N+ region 136. The P-type bulk area 130 is connected to ground via P+ region 142. A P-type dopant 140 may also be used for added capacitance. Yet another option is to use a degenerately doped (P+, in this example) wafer with a lightly doped epitaxial layer (P−, in this example) to provide both high capacitance and low resistance. As will be shown in subsequent figures, one advantage of the present invention is that high junction capacitance from Vdd to ground may be added without using any extra masks than those typically used in a SIMOX process.

Figure 3:
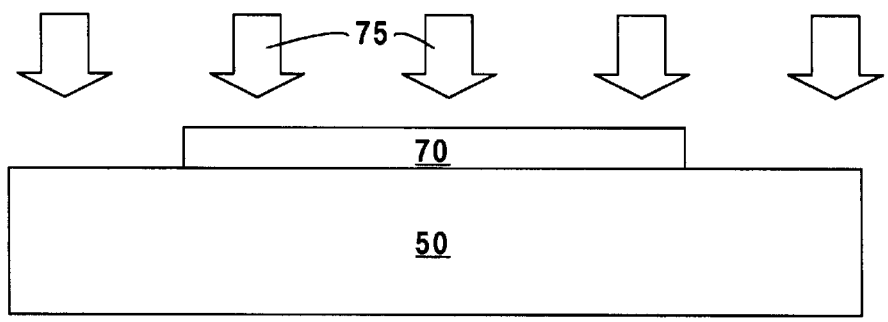
FIGS. 3, 4, 5 and 6 are cross-sectional views showing a fabrication sequence of FIG. 1 in accordance with a preferred embodiment of the present invention.
Figure 4:
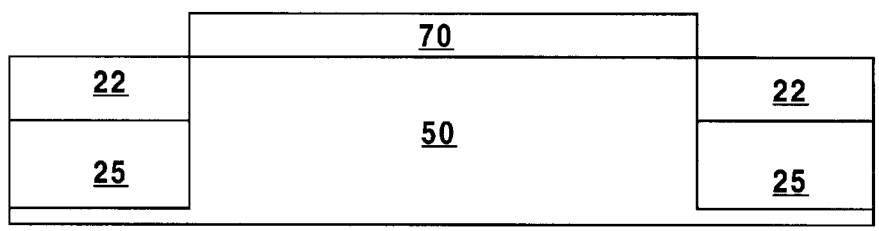
Figure 5:
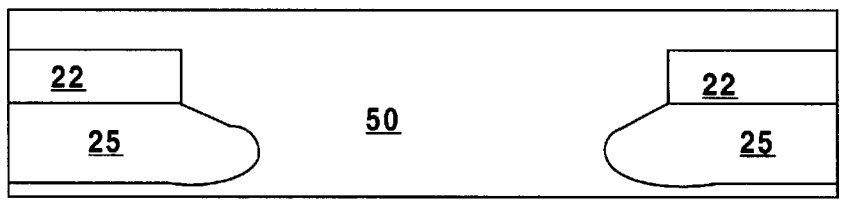
Figure 6:
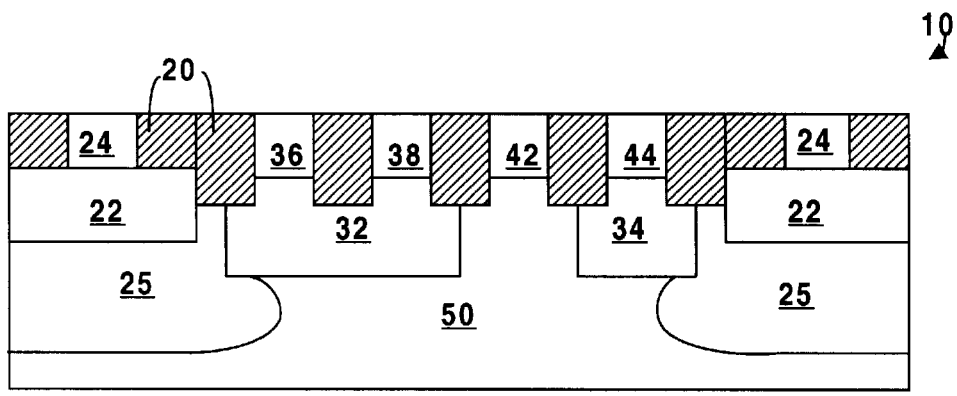

Referring now to FIGS. 3–6, fabrication of a preferred embodiment of the present invention will be discussed. As seen in FIG. 3, a non-critical mask 70 is used to define the second circuit regions (bulk area regions) of a substrate 50 of a second polarity type as described in FIG. 1. An oxygen and a dopant implant 75 of a first polarity type is then applied substantially simultaneously to substrate 50 to form an isolation oxide layer 22 and an implant layer 25 of the first polarity type buried under isolation oxide layer 22, as seen in FIG. 4. Since the isolation oxide layer 22 anneal temperature is rather high (approximately 1200–1300 degrees Celsius), the implant layer 25 will out-diffuse (i.e., diffuses beyond the implantation boundaries) as illustrated in FIG. 5. Thus, as shown in FIG. 6, after subsequent, standard formation of the SOI and bulk area regions, the implant layer 25 will connect to the wells 32 and 34 of the first polarity type in the bulk area region.

Thus, this invention provides a decoupling capacitance from Vdd to ground by implanting an implant layer under the isolation oxide. Furthermore, the implant may be done at the same time as the isolation oxide formation without the need of an extra mask. A second implant (such as a P+ or N+ dopant) may also be used for added capacitance.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. An apparatus comprising:
   a first circuit region having a first device layer over an isolation layer;
   a second circuit region adjacent the first circuit region having a second device layer over a well of a first polarity type; and
   an implant layer of the first polarity type implanted beneath the isolation layer, the implant layer having a distinct doping characteristic from the well, and wherein the implant layer is connected to the well and entirely separates the well from the isolation layer.

2. The apparatus of claim 1, wherein said well is an N-well, and said implant layer is an N-type implant layer.

3. The apparatus of claim 2, further comprising:
   a P-type implant layer implanted beneath said N-type implant layer.

4. The apparatus of claim 1, wherein said well is a P-well, and said implant layer is a P-type implant layer.

5. The apparatus of claim 3, further comprising:
   an N-type implant layer implanted beneath said P-type implant layer.

6. The apparatus of claim 1 wherein at least one of the first circuit region and the second circuit region comprises an active device.

7. A semiconductor device comprising:
   a substrate;
   a first circuit region in the substrate having an isolation layer beneath a first device formed in the substrate and an implant layer beneath the isolation layer, said implant layer having a first doping characteristic; and
   a second circuit region in the substrate adjacent the first region with a second device formed therein, said second circuit region having a well with a second doping characteristic different than the first doping characteristic; and
   wherein the implant layer is electrically coupled to the well, and
   wherein the implant layer entirely separates the well from the isolation layer.

8. The device of claim 7, wherein said well is an N-well, and said implant layer is an N-type implant layer.

9. The device of claim 8, further comprising:
   a P-type implant layer implanted beneath said N-type implant layer.

10. The device of claim 7, wherein said well is a P-well, and said implant layer is a P-type implant layer.

11. The apparatus of claim 10, further comprising:
    an N-type implant layer implanted beneath said P-type implant layer.

12. The semiconductor device of claim 7 wherein at least one of the first circuit region and the second circuit region comprises an active device.

13. In an apparatus having a bulk device region adjacent an SOI device region, the improvement comprising:
    an implant layer beneath an isolation layer in the SOI device region, said implant layer having a first doping characteristic, and connected to a well having a second doping characteristic different than the first doping characteristic and located beneath the bulk device region, and
    wherein the implant layer entirely separates the well from the isolation layer.

14. The apparatus of claim 13, wherein said well is an N-well, and said implant layer is an N-type implant layer.

15. The device of claim 13, wherein said well is a P-well, and said implant layer is a P-type implant layer.

16. The apparatus of claim 13 wherein the SOI device region includes an active device.

* * * * *